(12) United States Patent
Lee

(10) Patent No.: US 6,245,635 B1
(45) Date of Patent: Jun. 12, 2001

(54) METHOD OF FABRICATING SHALLOW TRENCH ISOLATION

(75) Inventor: Ellis Lee, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/203,042

(22) Filed: Nov. 30, 1998

(51) Int. Cl.[7] .................................................. H01L 21/76
(52) U.S. Cl. ......................... 438/407; 438/423; 438/433
(58) Field of Search ................................. 438/407, 433, 438/423

(56) References Cited

U.S. PATENT DOCUMENTS 4,833,098 * 5/1989 Kato .
5,780,346 * 7/1998 Arghavani et al. .
5,795,801 * 8/1998 Lee .

OTHER PUBLICATIONS

Wolf, Stanley, Silicion Processing for the VLSI Era, vol. 2, Lattice Press, pp. 56–58, 1990.*

* cited by examiner

Primary Examiner—Richard Booth
Assistant Examiner—Josetta Jones
(74) Attorney, Agent, or Firm—Charles C. H. Wu; Charles C. H. Wu & Associates, APC

(57) ABSTRACT

A method of fabricating a shallow trench isolation includes formation of a polishing stop layer. The polishing stop layer is formed in a fill material by performing ion implantation to implant atoms in the fill material. The depth of the polishing stop layer can be controlled by the energy of the implanted atoms. The polishing stop layer prevents the fill material from being dished by chemical-mechanical polishing. The polishing stop layer also prevents scratches from forming in the surface of the fill material, which is used to form isolation regions.

41 Claims, 12 Drawing Sheets

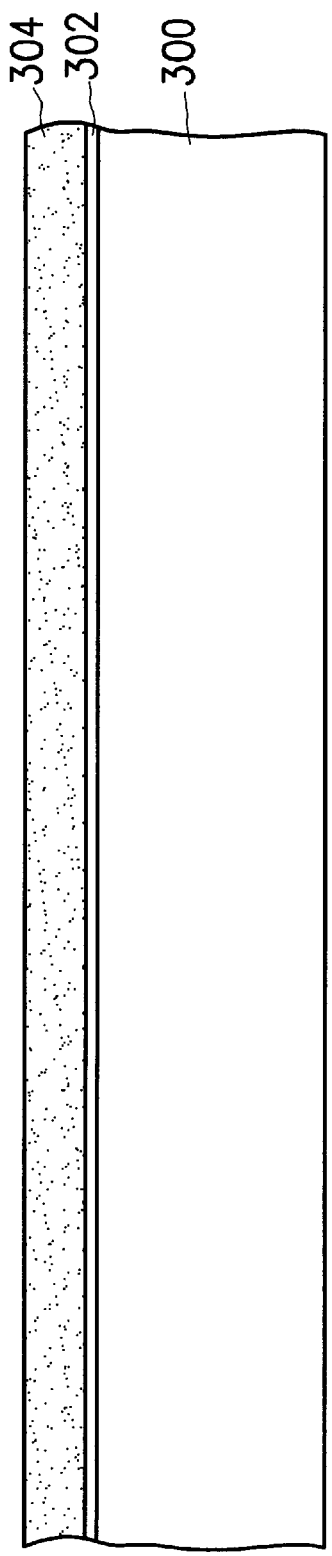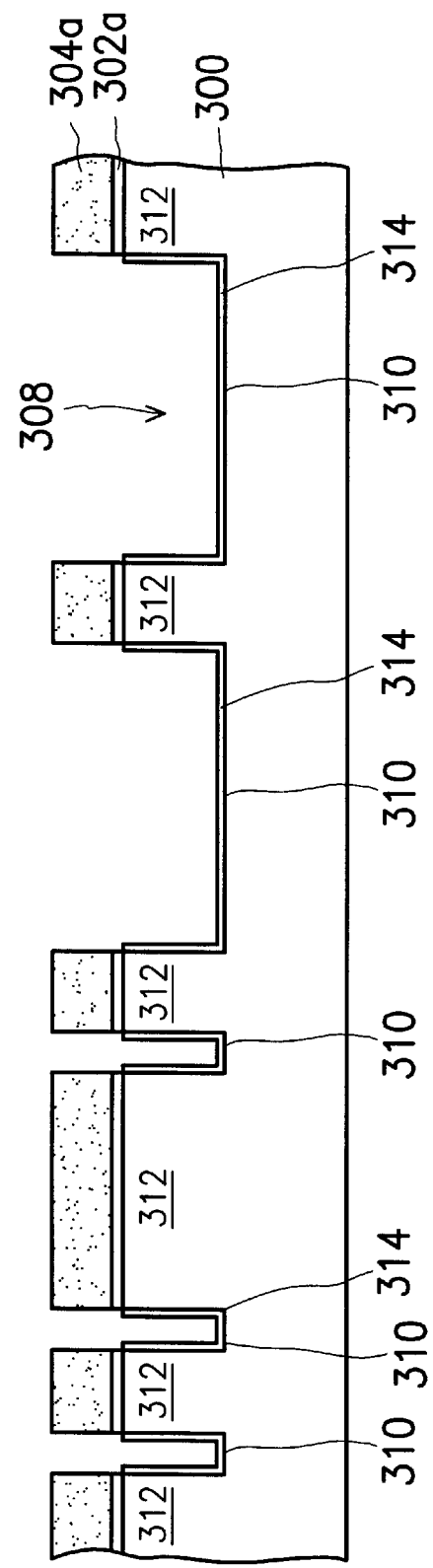

METHOD OF FABRICATING SHALLOW TRENCH ISOLATION

BACKGROUND OF THE INVENTION

1. Field of the Invention

The present invention relates to a semiconductor fabricating method. More particularly, the present invention relates to a method of fabricating an isolation region.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs. Conventionally, local oxidation of silicon (LOCOS) technique is widely utilized in the semiconductor industry to provide isolation regions among the various devices in the substrate. Since the LOCOS technique has been used for quite a period of time, it is one of the most reliable and low-cost method for fabricating the device isolation regions. However, there are still some difficulties in the LOCOS process. These include internal stress generation and bird's beak encroachment. For a highly integrated device, the problem of bird's beak encroachment by the isolation regions is especially difficult to avoid and thus the isolation regions cannot effectively isolate devices.

Shallow trench isolation (STI) technique is the other conventional method of forming isolation regions. A shallow trench isolation is formed by first anisotropically etching to form a trench in the substrate, and then depositing oxide in the trench to form an isolation region. Since shallow trench isolation is scaleable and has no bird's beak encroachment problem as found in the conventional LOCOS technique, it has become widely used for forming sub-micron CMOS circuits.

FIGS. 1A through 1B are schematic, cross-sectional views showing a conventional method of fabricating a shallow trench isolation.

In FIG. 1A, a patterned mask layer 104 is formed on a substrate 100. The patterned mask layer 102 is used as an etching mask when an etching step is performed. Trenches 107 and 108 are formed in the substrate 100 by etching. A silicon oxide layer 116 is formed over the substrate 100 to cover the patterned mask layer 104. The trenches 107 and 108 are filled by the silicon oxide layer 116.

In FIG. 1B, a planarization process is performed, first by chemical-mechanical polishing, and then by etching. The patterned mask layer 104 is used as a polishing stop layer. A portion of the silicon oxide layer 116 is removed by chemical-mechanical polishing (CMP) until the patterned mask layer 114 is exposed. The patterned mask layer 104 is removed by etching while retaining portions of silicon layer 116 in the trenches 107 and 108, which completes construction of isolation regions 117 and 118. The isolation regions 117 and 118 are used to isolate active regions of the substrate 100.

In the steps described above, the patterned mask layer 104 is harder than the silicon oxide layer 116 so that the patterned mask layer 104 can be used as the polishing stop layer while a portion of the silicon oxide layer 116 is removed. Hence, surface planarization is achieved.

However, variations in pattern density can lead to variation density of the patterned mask layer 104. Thus, after chemical-mechanical polishing, both the wide isolation regions 117 and the narrow isolation regions 118 are formed. The variation density of the patterned mask layer 104 causes local nonuniformity in the CMP process. In other words, the mask layer 104 is used as the polishing stop layer when chemical-mechanical polishing is performed. Additionally, the load of wide isolation regions 117 and load of narrow isolation regions 118 are different. The high-density active regions isolated by narrow isolation regions 118 have correspondingly more polishing stop material provided by the mask layer 104. The CMP process tends to equalize the surface of the mask 104 and the uppermost surface of the narrow isolation regions 118. After the planarization process, each surface 148 of the narrow isolation regions 118 is roughly level with the substrate surface 142. In contrast with the narrow isolation regions 118, the wide isolation regions 117 have correspondingly less polishing stop material. Therefore, the isolation regions 117 are easily dished by polishing, which is called a dishing effect. Furthermore, the surface 140 can be recessed below the surface 142 of the substrate 100, which further leads to the exposed corner regions 144 of the trenches 107. The gate oxide layer (not shown) and the gate conductive layer will cover the corner regions 144 in the following step of forming a MOS transistor (not shown). The presence of the corner regions 144 in the MOS transistor can cause sub-threshold leakage current in a channel region of the MOS transistor during the periods when the MOS transistor is switched off.

In addition, the CMP process is accomplished by abrading the surface of the silicon oxide layer 116 with a slurry. Since particles of the slurry are harder than silicon oxide, the surface of the silicon oxide layer 116 is easily scratched by the particles, which scratching results in the formation of microscratches. The microscratches in the surface of the silicon oxide layer 116 easily become deep scratches 146 after the subsequent steps, such as a cleaning step and an etching step, for example. The gate conductive layer easily remains in the scratches. In this manner, bridges between MOS transistors in neighboring active regions beside isolation regions occur.

To overcome the local nonuniformity in the CMP process cited above, a method is provided as described in Suresh Venkatesan et al., U.S. Pat. No. 5,459,096, "Process for Fabricating a Semiconductor Device Using Dual Planarization Layers". Reference is made to FIGS. 2A through 2C, which explains the fabricating process proposed by Suresh Venkatesan et al.

In FIG. 2A, a substrate 200 having recessed regions 210 and elevated regions 212 is provided. A pad oxide layer 202 and a planarization layer 204 are formed in sequence over the elevated regions 212 of the substrate 200. A liner layer 214 is formed on the recessed regions 210. A fill material is 216 deposited over the substrate 200 to fill the recessed regions 210 and cover the planarization layer 204.

In FIG. 2B, portions of the oxide layer 216 are removed to expose portions of the planarization layer 204 above the elevated regions 212. The fill material 216 is removed to leave dielectric portions 216a. A silicon nitride layer 220 is formed over the substrate 200 to cover the dielectric portions 216a and the planarization layer 204. Because of the topographic contrast in the substrate 200 creased by recessed regions 210 and elevated regions 212, the dielectric portions 216a has protruding regions at the edge of dielectric portions 216a.

In FIG. 2C, a planarization process is performed by chemical-mechanical polishing and wet etching. The dielectric portions 216b remaining from the dielectric portions 216a is level with the surface of the elevated regions 212.

In the method described above, the fill material 216 above the elevated regions 212 is removed at first to expose the planarization layer 204. Then, the planarization layer 220 is formed over the substrate 200. The planarization layer 220 above the recessed regions 210 and the planarization layer 204 are used as polishing stop layers to protect the dielectric portions 216a in the recessed regions 210 in the following CMP process. In this manner, local nonuniformity in a CMP process arising from the variations in the pattern density can be reduced.

SUMMARY OF THE INVENTION

It is an object of the invention to provide a method to fabricate a shallow trench isolation. In the invention, formation of the polishing stop layer prevents fill materials in trenches from dishing during chemical-mechanical polishing.

It is another object of the invention to provide a method for fabricating a shallow trench isolation, which prevents the local nonuniformity occurring in the CMP process.

It is yet another object of the invention to provide a method to fabricate a shallow trench isolation, which prevents fill materials in trenches from forming scratches in the surface.

To achieve these and other advantages and in accordance with the purpose of the invention, as embodied and broadly described herein, the invention provides a method of forming a shallow trench isolation. The method includes formation of a pad oxide layer on a substrate. A mask layer is formed over the substrate. The mask layer and the pad oxide layer are patterned to form trenches in the substrate. A liner layer is formed on the substrate exposed by the trenches. A fill material is formed over the substrate to fill the trenches. The fill material covers the first mask layer and the liner layer. An ion implantation process is performed to implant atoms in the fill material, which forms a polishing stop layer. A planarization process is performed to form a smooth surface over the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A through 3E are schematic, cross-sectional views showing a method of fabricating a shallow trench isolation according to one preferred embodiment of the invention.

DESCRIPTION OF THE PREFERRED EMBODIMENTS

Figure 1A:
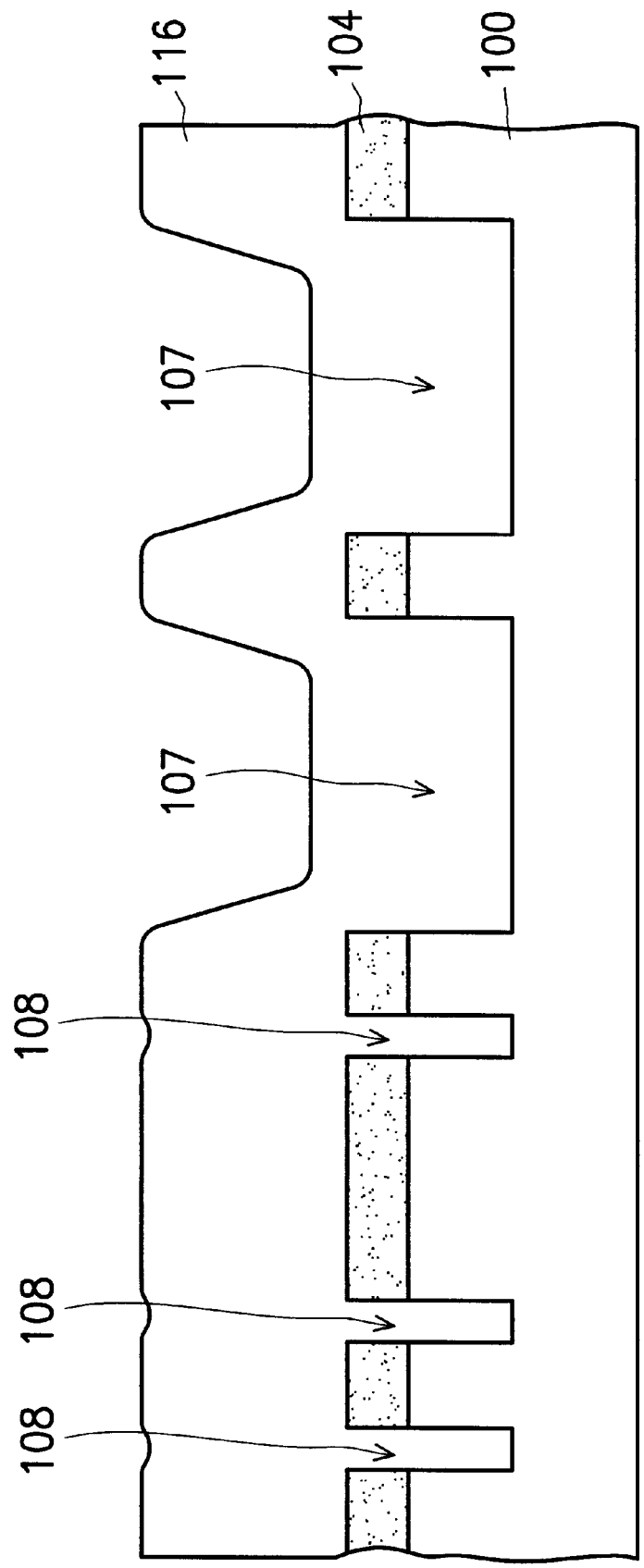
FIGS. 1A through 1B are schematic, cross-sectional views showing a conventional method of fabricating a shallow trench isolation.
Figure 1B:
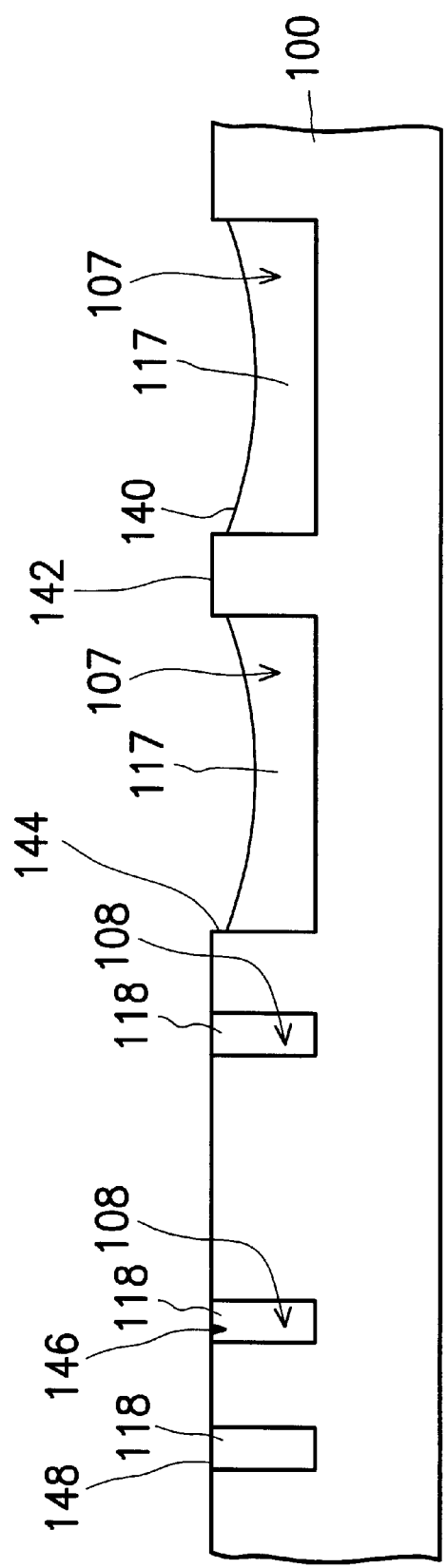
Figure 2A:
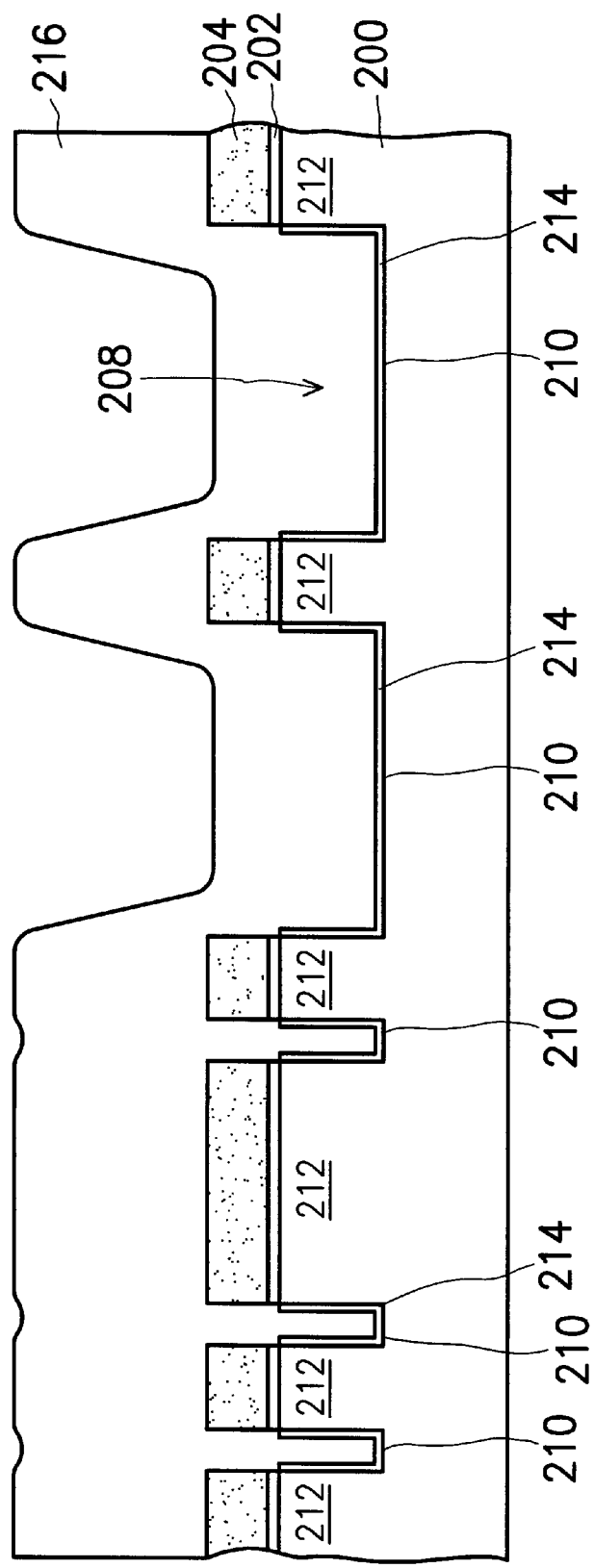
FIGS. 2A through 2C are schematic, cross-sectional views showing another conventional method of fabricating a semiconductor device.
Figure 2B:
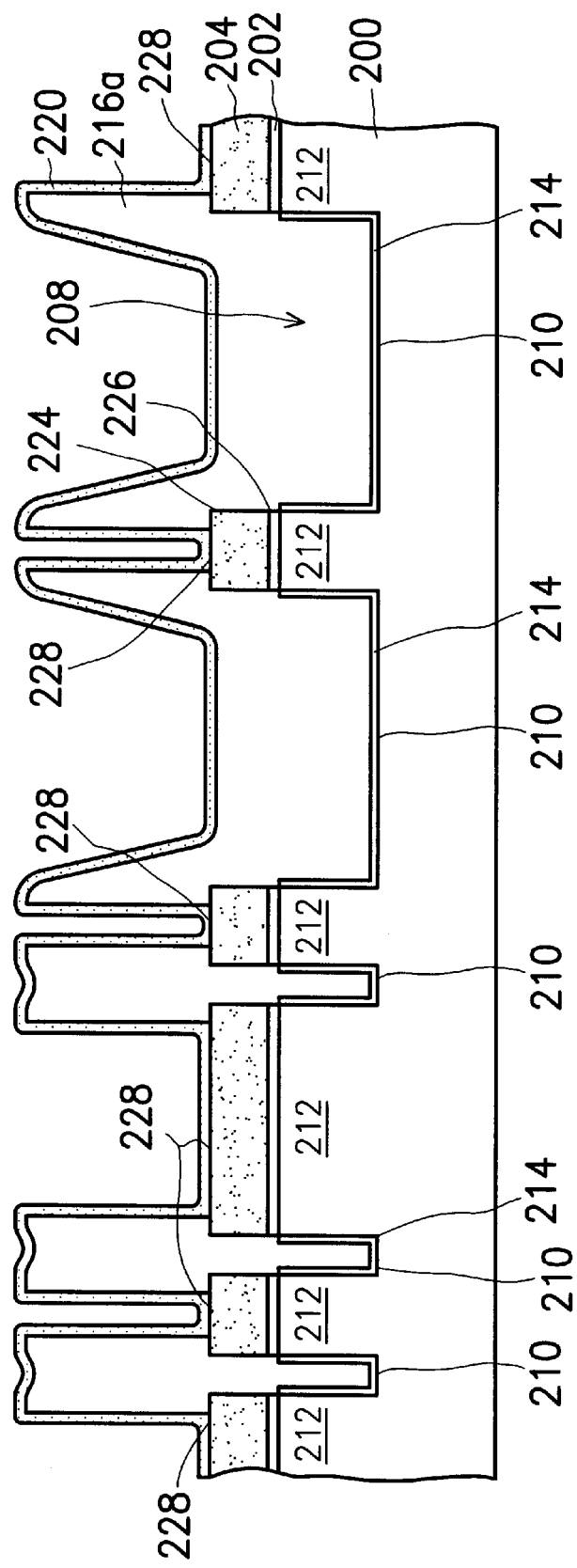
Figure 2C:
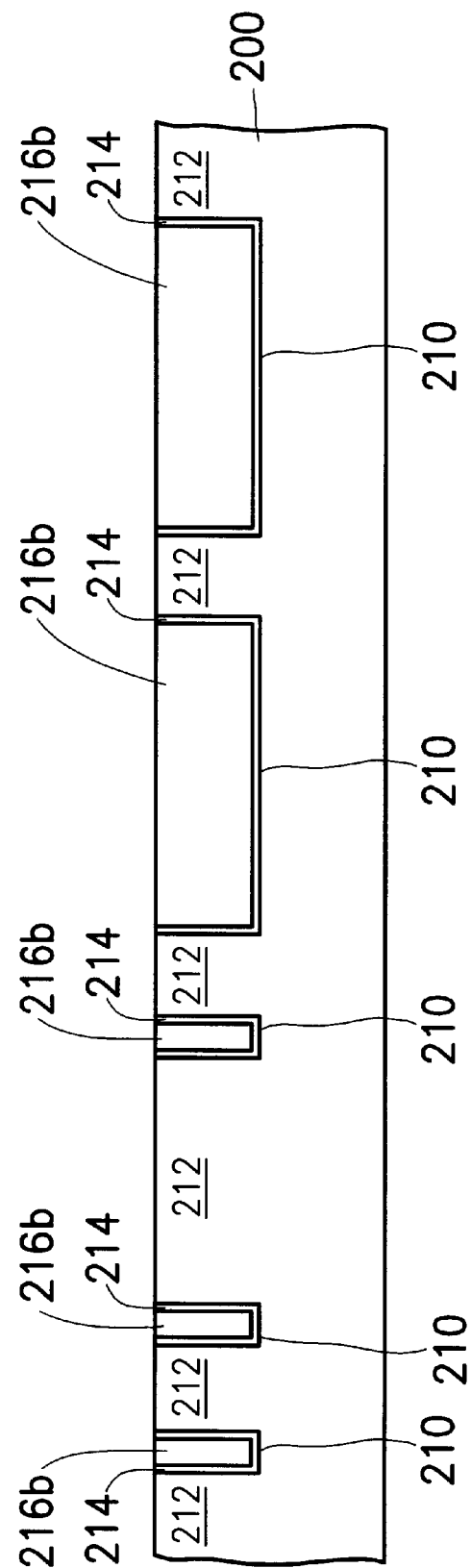

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are schematic, cross-sectional views showing a method of forming a shallow trench isolation according to one preferred embodiment of the invention.

Figure 3C:
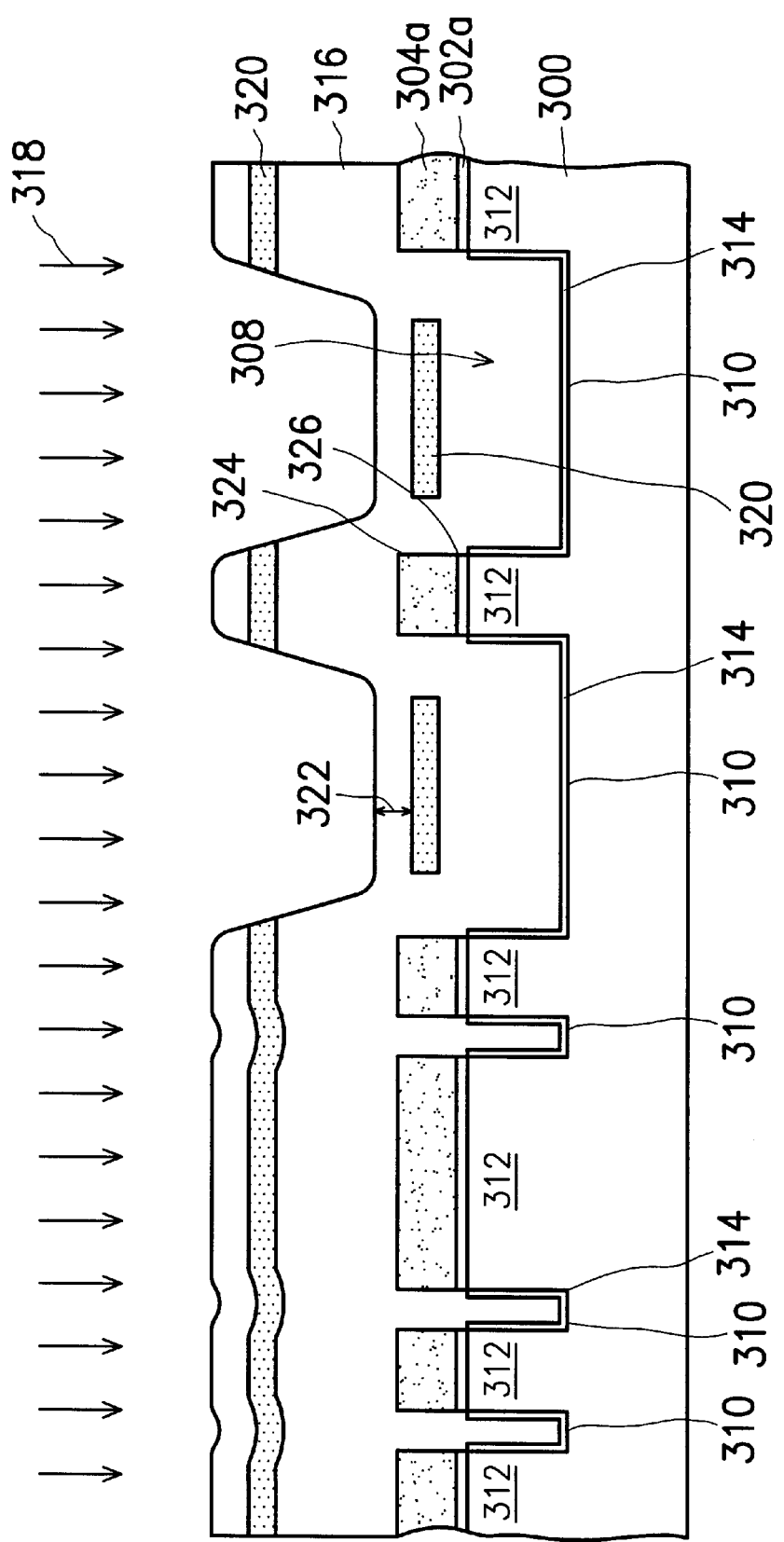

In FIG. 3A, a pad oxide layer 302 is formed on a substrate 300. The pad oxide layer 302 is used to protect the substrate 300. The pad oxide layer 302 can be formed by thermal oxidation. A mask layer 304 is formed on the pad oxide layer 302. As it is to be seen as follows, the mask layer 304 preferably is a material capable of providing both an etching stop for the etching step and providing a polishing stop for a CMP process. In order to achieve the purposes of the mask layer 304 described above, the materials of the mask layer 304 and the substrate 300 are different, and furthermore, the mask layer 304 is harder than a fill material filled in a trench (shown in FIG. 3C). That is, the material of the mask layer 304 preferably is silicon nitride when the material of the substrate 300 is silicon and the fill material in the trench is silicon oxide. The mask layer 304 can be formed by chemical vapor deposition, for example.

In FIG. 3B, the mask layer 304 and the pad oxide layer 302 are patterned to form trenches 308 in the substrate 300. The surface of the substrate 300 includes recessed regions 310 and elevated regions 312 after the trenches 308 are formed. The elevated regions 312 are separated by the recessed regions 310. Regions of the recessed regions 310 are also called the trenches 308. The elevated regions 312 of the substrate 300 are covered by the mask layer 304a and the pad oxide layer 302a. The trenches 308 can be formed by the following exemplary steps. A patterned photoresist layer (not shown) is formed over the mask layer 304. The mask layer 304 and the pad oxide layer 302 are etched to form the patterned mask layer 304a and the patterned pad oxide layer 302a. The patterned photoresist layer is removed. The mask layer 304a is used as a mask when etching. The substrate 300 is etched by anisotropic etching, such as reactive ion etching, for example. to form the trenches 308.

Preferably, a liner layer 314 is formed on the substrate 300 exposed by the trenches 308. The liner layer 314 is formed in order to enhance the isolation ability of the shallow trench isolation (shown in FIG. 3E). The material of the liner layer 314 preferably is silicon oxide. The liner layer 314 can be formed by thermal oxidation, for example, to a preferable thickness of about 50 Å to 1000 Å (angstroms).

In FIG. 3C, a fill material 316 is formed over the substrate 300 to fill the trenches 308. The fill material 316 covers the liner layer 314 and the mask layer 304a. Preferably, the fill material 316 is silicon oxide deposited by chemical vapor deposition, such as atmospheric chemical vapor deposition and using a tetra-ethyl-ortho-silicate (TEOS) source gas. Preferably, a densification step is performed at a temperature of about 1000° C. for 10 minutes to 30 minutes after the fill material 316 is deposited. The thermal material 316 is densified by the densification step.

An ion implantation process 318 is performed to implant atoms in the fill material 316. The atoms are implanted into the fill material 316 at a predetermined depth 322. Preferably, a thermal step is performed after the ion implantation. The implanted fill material is transform to a polishing stop layer 320 at the depth 322 of the fill material 316. The polishing stop layer 320 provides a hardness sufficient to be used as a polishing stop layer after the thermal step. For example, when the material of the fill material 316 is silicon oxide, implanted atoms preferably are nitrogen atoms. In this manner, the hardness of the polishing stop layer 320 is about 8 to 9 on the Mohs scale, whereas the hardness of the fill material 316 is about 6 to 7 on the Mohs scale. That is, the polishing stop layer 320 is harder than the fill material 316. The depth 322 of the polishing stop layer 320 can be controlled by implanting-energy intensity in the ion implantation process. Preferably, the bottom-surface level of the polishing stop layer 320 directly above the recessed region 310 is roughly between the top surface 324 of the mask layer 304a and the bottom surface 326 of the mask layer 304a. For example, using the implanting energy of about 50 Kev to 100 Kev with dosage of about $2 \times 10^4$ ions/cm$^2$ to $6 \times 10^4$ ions/cm$^2$ for about 60 seconds to 70 seconds forms the polishing stop layer 320 at the predetermined depth 322 of between about 1000 Å and 2000 Å.

Figure 3D:
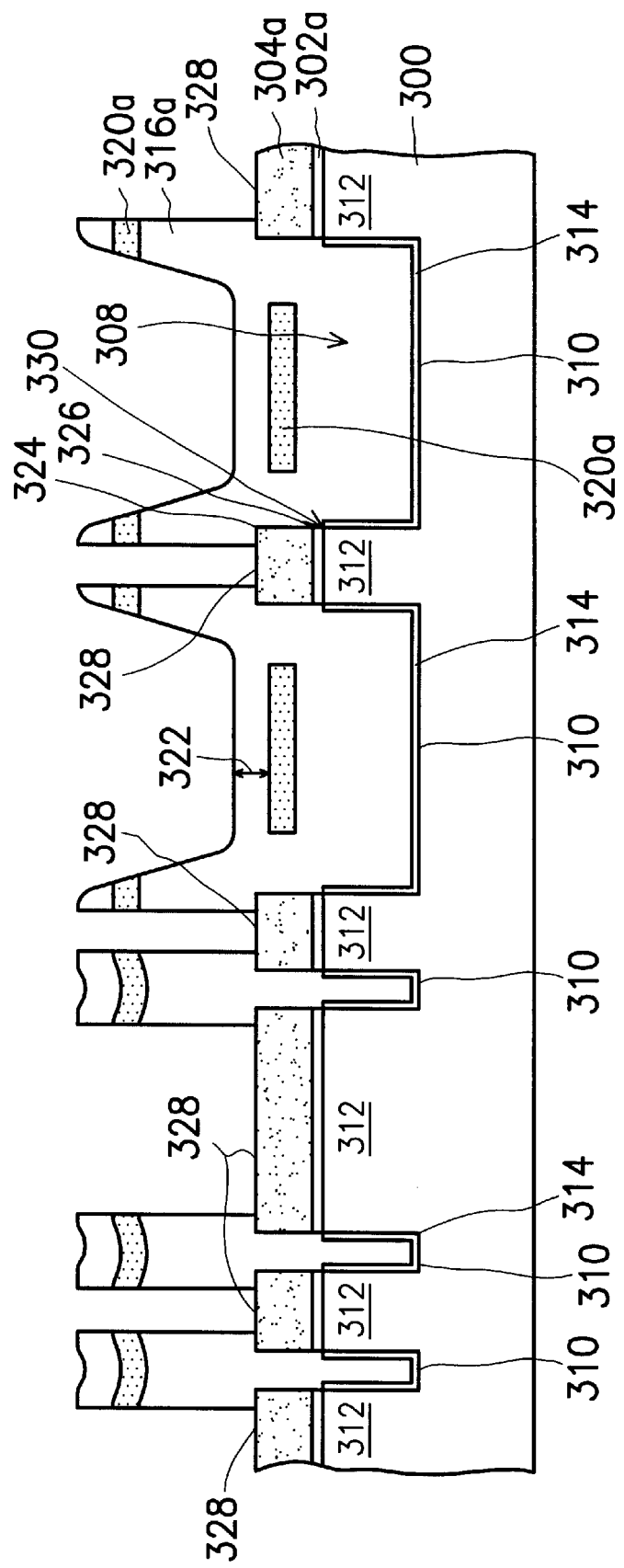

In FIG. 3D, portions of the isolation layer 316 and the polishing stop layer 320 preferably are selectively removed to leave a polishing stop layer 320a and an isolation layers 316a before a planarization process is performed. Surfaces 328 of the mask layer 314a located over the elevated regions 312 are exposed. Due to the topographic contrast in the surface of fill material 316 created by the recessed regions 310 and the elevated regions 312, protruding regions at the edge of fill material 316a are formed after portions of the fill material 316 and portions of the polishing stop layer 320 are removed. Typically, the fill material 316 and the polishing stop layer 320 are removed by a photolithographic process. In the photolithographic process, a photoresist layer (not shown) is formed over the fill material 316. The pattern of the photoresist layer is opposite to the pattern of the photoresist layer used while forming the trenches 308 in the substrate 300. An etching step is performed to remove portions of the fill material 316 and the polishing stop layer 320. The etching rates of the fill material 316 and the polishing stop layer 320 are nearly the same in the etching step. Another etching step is performed to remove the remaining portions of the fill material 316 until the mask layer 304a is exposed. This etching step has a high selectivity to the fill material 316 and the mask layer 304a. The polishing stop layer 320a, which remains from the polishing stop layer 320, is formed. The fill material 316a, which remains from the isolation layer 316, is formed. The surface 328 of the mask layer 304a over the elevated region 312 is exposed.

Figure 3E:
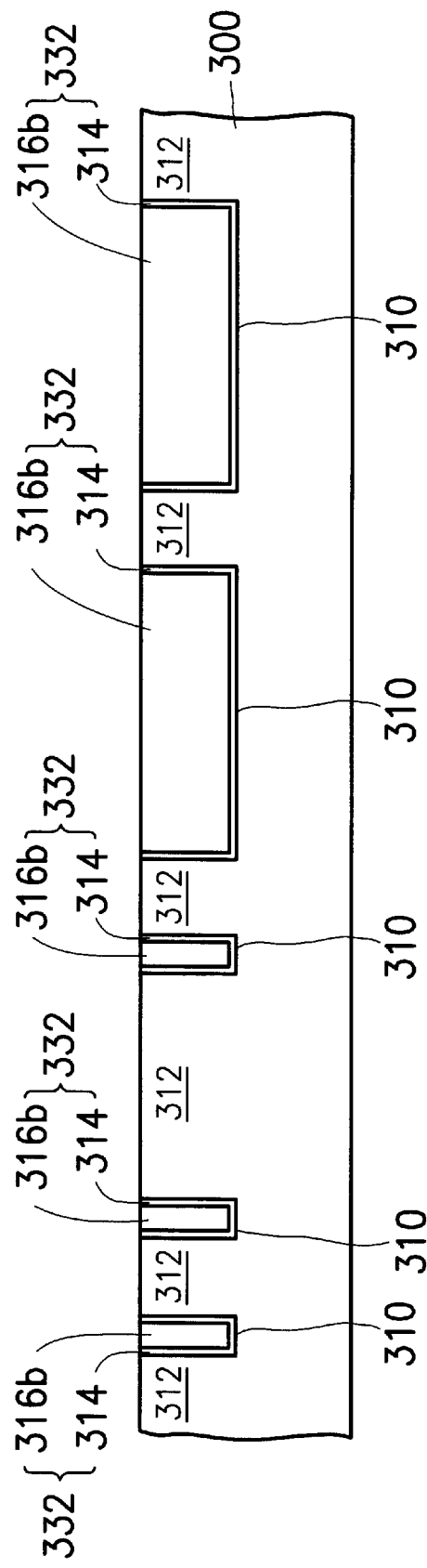

In FIG. 3E, a planarization process is performed to obtain a smooth surface over the substrate 300. Shallow trench isolations 322 are formed in the recessed regions 310 of the substrate 300. The planarization process preferably is performed by first chemical-mechanical polishing, and then etching. Preferably, a slurry used in chemical-mechanical polishing is a potassium hydroxide (KOH) solution having silicon oxide particles therein or a KH$_4$OH solution, for example. The protruding regions formed by portions of the polishing stop layer 320a and the fill material 316a above the corner regions 330 are much higher, so that they can be first removed by polishing. The polishing stop layer 320a directly above the recessed regions 310 is roughly level with the mask layer 304a, and furthermore, the polishing stop layer 320a and the mask layer 304a are harder than the isolation layers 316a. Thus, the polishing stop layer 320a above the recessed regions 310 and the mask layer 304a are used as a polishing stop point while polishing. The isolation layers 316a in the recessed regions 310 is protected by using the polishing stop layer 320a and the mask layer 304a as the polishing stop point, so that the dishing effect can be reduced. Additionally, the microscratches do not occur in the surface of the isolation layers 316a. A wet etching step is performed after the chemical-mechanical polishing step. The mask layer 304a, the polishing stop layer 320a, the pad oxide layer 302a, and the isolation layers 316a are removed to form shallow trench isolations 332 in the recessed regions 310 of the substrate 300. Each of the shallow trench isolations is formed by the liner oxide layer 314 together with one of the isolation layers 316b, which remains from the isolation layers 316a.

FIGS. 4A through 4D are schematic, cross-sectional views showing a method of forming a shallow trench isolation according to another preferred embodiment of the invention.

Figure 4A:
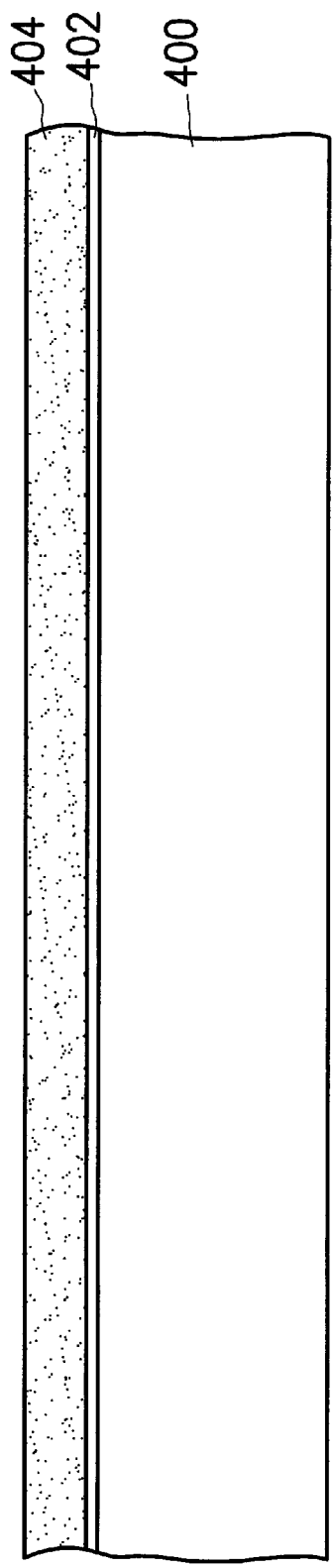
FIGS. 4A through 4D are schematic, cross-sectional views showing a method of fabricating a shallow trench isolation according to another preferred embodiment of the invention.

In FIG. 4A, a pad oxide layer 402 is formed on a substrate 400. The pad oxide layer 402 is used to protect the substrate 300. The pad oxide layer 402 can be formed by thermal oxidation. A mask layer 404 is formed on the pad oxide layer 402. The mask layer 404 is preferably a material capable of providing both an etching stop for the etching step and providing a polishing stop for a CMP process. The materials of the mask layer 404 and the substrate 400 must be different. The mask layer 404 is harder than a fill material in a trench (shown in FIG. 4C). The material of the mask layer 404 preferably is silicon nitride when the material of the substrate 400 is silicon and the fill material in the trench is silicon oxide. The mask layer 404 can be formed by chemical vapor deposition, for example.

Figure 4B:
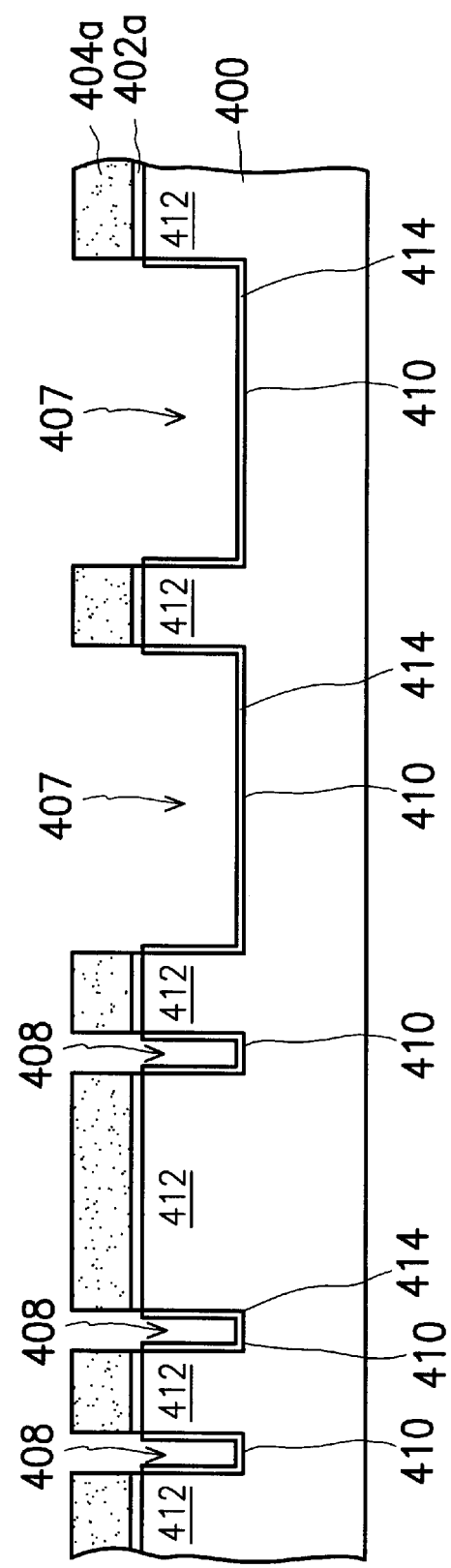

In FIG. 4B the mask layer 404 and the pad oxide layer 402 are patterned to form trenches 407 and trenches 408 in the substrate 300. The trenches 407 are formed with wide areas and the trenches 408 are formed with narrow areas. The surface of the substrate 400 is composed of recessed regions 410 and elevated regions 412 after the trenches 407 and the trenches 408 are formed. The elevated regions 412 are separated by the recessed regions 410. Regions of the recessed regions 410 are also called the trenches 407 or the trenches 408. The elevated regions 412 of the substrate 400 are covered by the mask layer 404a and the pad oxide layer 402a. The trenches 407 and the trenches 408 can be formed by the following exemplary steps. A patterned photoresist layer (not shown) is formed over the mask layer 404. The mask layer 404 and the pad oxide layer 402 are etched to form the patterned mask layer 404a and the patterned pad oxide layer 402a. The patterned photoresist layer is removed. The mask layer 404a is used as a mask when etching. The substrate 400 is etched by anisotropic etching, such as reactive ion etching, to form the trenches 407 and the trenches 408 in the substrate 400.

Preferably, a liner layer 414 is formed on the substrate 400 exposed by the trenches 407 and the trenches 408. The liner layer 414 is formed in order to enhance the isolation ability of the shallow trench isolation (shown in FIG, 4E). The material of the liner layer 414 preferably is silicon oxide. The liner layer 414 can be formed by thermal oxidation, for example, to a preferable thickness of about 50 Å to 1000 Å.

Figure 4C:
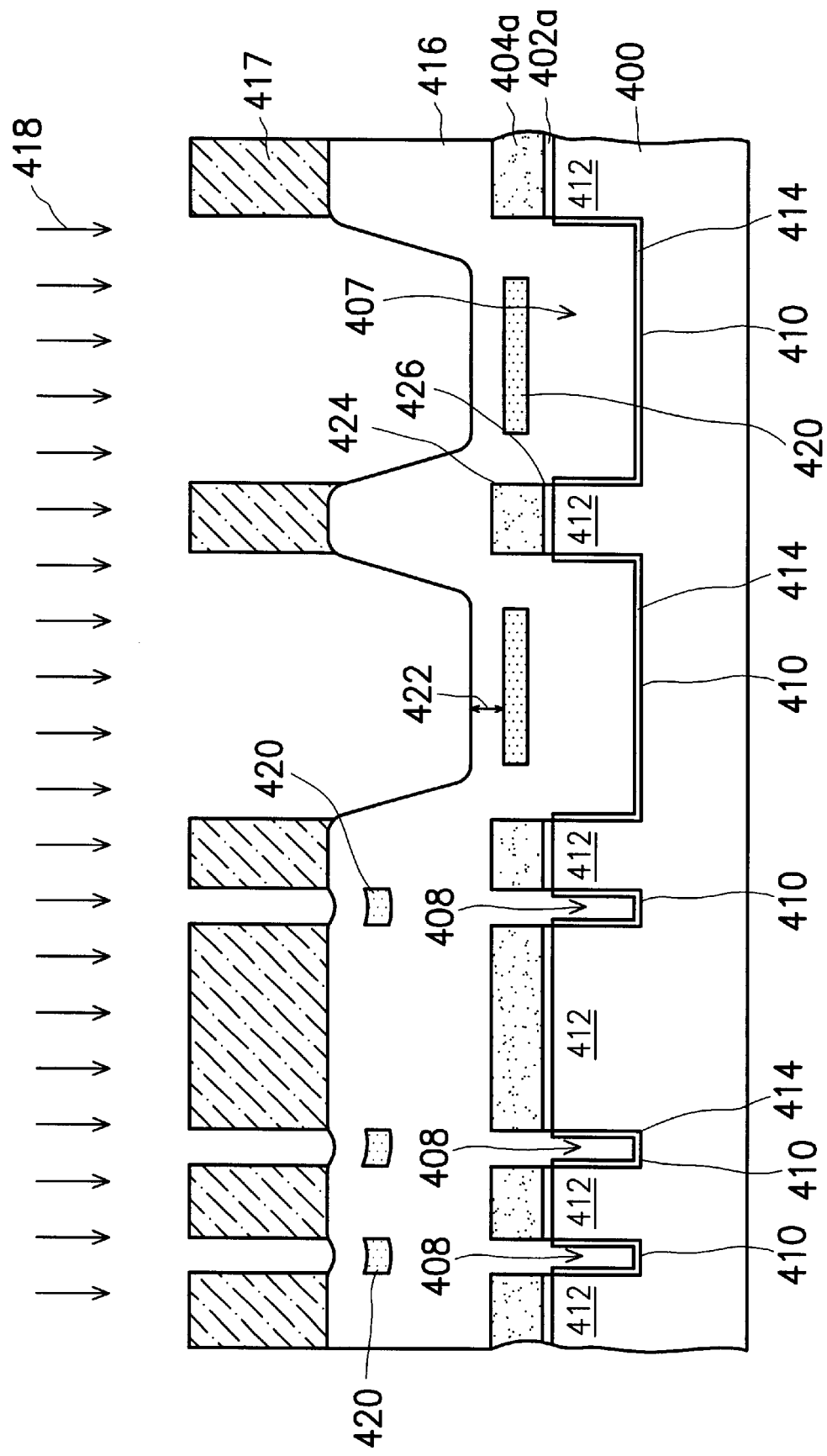

In FIG. 4C, a fill material 416 is formed over the substrate 400 to fill the trenches 407 and the trenches 408. The fill material 416 covers the liner layer 414 and the mask layer 404a. Preferably, the fill material 416 is silicon oxide deposited by chemical vapor deposition, such as atmospheric chemical vapor deposition and using a tetra-ethyl-orthosilicate (TEOS) source gas. Preferably, a densification step is performed at a temperature of about 1000° C. for 10 minutes to 30 minutes after the fill material 416 is deposited. The thermal material 416 is densified after the densification step.

A patterned mask layer 417 is formed over the substrate 400. The patterned mask layer 417 at least exposes the fill material 416 directly above the trenches 407. Preferably, the mask layer 417 is formed by the original photoresist layer (not shown) used in the step of forming the trenches 417 and the trenches 418, such that the fabrication cost can be reduced. Typically, the patterned mask layer 417 can be formed in the following exemplary steps. A photoresist layer (not shown) is formed on the fill material 416. The photoresist layer is patterned by using the original photoresist layer, which is used in the step of forming the trenches 407 and the trenches 408. The photoresist layer is patterned to form the patterned mask layer 417. An ion implantation process 418 is performed by using the mask layer 417 as a mask to implant atoms in the fill material 416 exposed by the mask layer 417. The atoms are implanted into the fill material 416 at a depth 422. A thermal step is performed. The implanted fill material is transformed into a polishing stop layer 420 at a predetermined depth 422 of the fill material 416. After the thermal step, the polishing stop layer 420 has a hardness sufficient to be used as a polishing stop point. When the material of the fill material 416 is silicon oxide, implanted ions preferably are nitrogen ions. The hardness of the polishing stop layer 420 is about 8 to 9 on the Mohs scale, whereas the hardness of the fill material 416 is about 6 to 7 on the Mohs scale. That is, the polishing stop layer 420 is harder than the fill material 416. The depth 422 of the polishing stop layer 420 can be controlled by intensity of implanting energy. Preferably, the bottom-surface level of polishing stop layer 420 is between the top surface 424 of the mask layer 404a and the bottom surface 426 of the mask layer 404a. For example, using the implanting energy of about 50 Kev to 100 Kev with a dosage of about $2 \times 10^{14}$ ions/cm$^2$ to $6 \times 10^{14}$ ions/cm$^2$ to implant the fill material 416 for about 60 seconds to 70 seconds, which forms the polishing stop layer 420 at depth 422 of between about 1000 Å and 2000 Å.

Figure 4D:
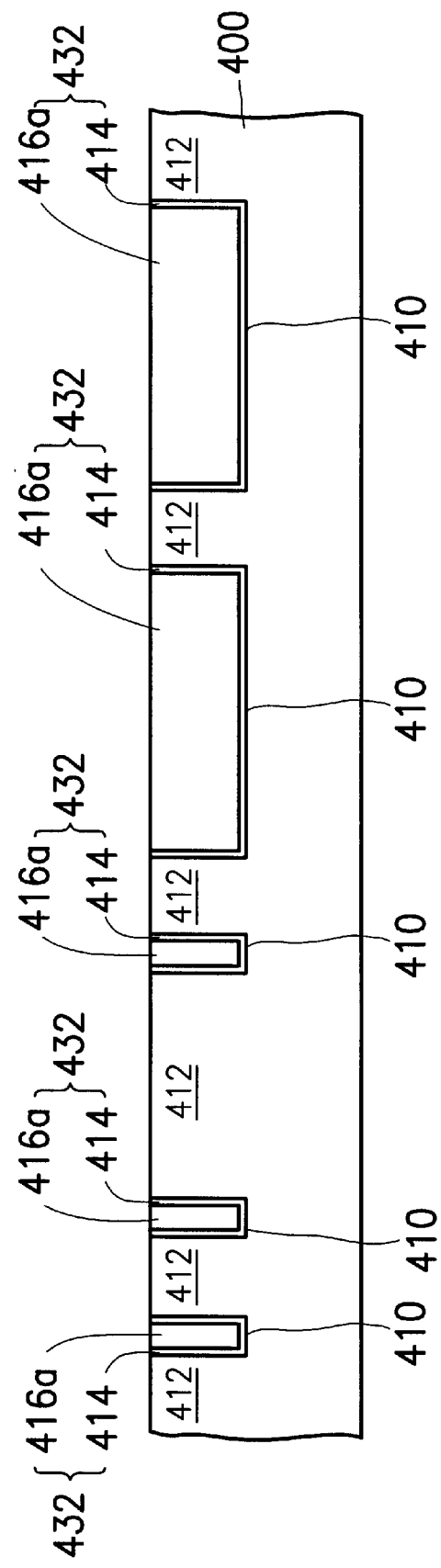

In FIG. 4D, the mask layer is removed. The mask layer can be removed by ashing using oxygen plasma, for example. A planarization process is performed to planarize the uppermost surface of the substrate 400. A smooth surface thus is obtained. The planarization process preferably is performed by chemical-mechanical polishing and etching. Preferably, chemical-mechanical polishing slurry used in chemical-mechanical polishing is a KOH solution having silicon oxide particles therein with a average particle size of about 800 Å to 1200 Å or a KH$_4$OH solution, for example. Because the polishing stop layers 420 above the narrow trenches 408 are higher than the polishing stop layers 420 above the wide trenches 407, the polishing stop layers 420 directly above the narrow trenches 408 can be removed before removing the polishing stop layers 420 above the wide trenches 407. The polishing stop layers 420 directly above the wide trenches 407 are roughly level with the mask layer 404a, and furthermore, the polishing stop layer 420 and the mask layer 304a are harder than the isolation layers 416a. Thus, the polishing stop layer 420 above the recessed regions 410 and the mask layer 404a are used as a polishing stop point when polishing is performed. The isolation layers 416a in the recessed regions 410 are protected by using the polishing stop layer 420 and the mask layer 404a as the polishing stop point. Thus, the isolation layers 416a are not dished by polishing. The scratches do not occur in the surface of the isolation layers 416a, as well. Since the pattern of the polishing stop layer 420 depends on the pattern of the mask layer 417, and the pattern of the mask layer 417 depends on the pattern of the trenches, the region occupied by the polishing stop layer 420 above the wide trenches 408 within the fill material 416 is proportionally small. Thus, the polishing stop layer 420 can be easily removed during the planarization process. The removal rate is not effectively affected by the formation of the polishing stop layer 420.

In summary, the advantages of the invention include the following:

1. The invention uses ion implantation to implant atoms in a fill material. The implanted fill material was transformed to a polishing stop layer. In addition, a predetermined depth of the polishing stop layer can be controlled by intensity of implanting energy. And thus, the depth of the polishing stop layer is independent of the thickness of the fill material.

2. Portions of the fill material and etching stop layer are removed to expose a mask layer above elevated regions after forming the polishing stop layer by ion implantation. In this manner, the removal rate of the fill material can be increased and the uniformity in a CMP process is also enhanced.

3. In the invention. the polishing stop layer is used to prevent the fill material from being dished by a planarization process and prevents formation of scratches.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation, comprising the steps of:

forming a pad oxide on a substrate;

forming a mask layer over the substrate;

patterning the mask layer and the pad oxide layer to form a plurality of trenches in the substrate;

forming a liner layer on the substrate exposed by the trenches;

forming a fill material over the substrate to fill the trenches, wherein the fill material covers the first mask layer and the liner layer;

performing an ion implantation process to implant atoms in the fill material, which forms a polishing stop layer; and performing a planarization process to form a smooth surface over the substrate.

2. The method of claim 1, wherein the fill material comprises silicon oxide.

3. The method of claim 1, further comprising a thermal step after forming the polishing stop layer.

4. The method of claim 1, wherein the bottom-surface level of the polishing stop layer above the recessed region is between the top surface of the mask layer and the bottom surface of the mask layer.

5. The method of claim 1, wherein the implanted atoms comprises nitrogen atoms.

6. The method of claim 5, wherein energy of the nitrogen atoms is between about 50 Kev and 100 Kev.

7. The method of claim 5, wherein the dosage of the nitrogen atoms is between about $2 \times 10^{14}$ ions/cm$^2$ and $6 \times 10^{14}$ ions/cm$^2$.

8. The method of claim 5, wherein the nitrogen atoms are implanted for about 60 seconds to 70 seconds.

9. The method of claim 5, wherein depth of the polishing stop layer is between about 1000 Å and 2000 Å.

10. The method of claim 5, wherein the polishing stop layer has a hardness between about 8 and 9 on the Mohs scale.

11. The method of claim 1, wherein the planarization process comprises chemical-mechanical polishing.

12. A method of fabricating a shallow trench isolation, comprising the steps of:
providing a substrate having a plurality of elevated regions and recessed regions, wherein a first mask layer is formed above the elevated region, and a liner layer is formed the recessed regions;
forming a fill material over the substrate to fill the recessed regions, wherein the fill material covers the first mask layer and the liner layer;
forming a second mask over the substrate to at least expose the fill material above the recessed regions;
performing an ion implantation process to implant atoms in the fill material exposed by the second mask, which forms a polishing stop layer;
removing the second mask layer; and
performing a planarization step to form a smooth surface over the substrate.

13. The method of claim 12, wherein the fill material comprises silicon oxide.

14. The method of claim 12, further comprising a thermal step after forming the polishing stop layer.

15. The method of claim 12, wherein the bottom-surface level of the polishing stop layer above the recessed region is between the top surface of the mask layer and the bottom surface of the mask layer.

16. The method of claim 12, wherein the implanted atoms comprises nitrogen atoms.

17. The method of claim 16, wherein energy of the nitrogen atoms is between about 50 Kev and 100 Kev.

18. The method of claim 16, wherein dosage of the nitrogen atoms is between about $2 \times 10^{14}$ ions/cm$^2$ and $6 \times 10^{14}$ ions/cm$^2$.

19. The method of claim 16, wherein the nitrogen atoms is implanted for about 60 seconds to 70 seconds.

20. The method of claim 16, wherein depth of the polishing stop layer is between about 1000 Å and 2000 Å.

21. The method of claim 16, wherein the polishing stop layer has a hardness between about 8 and 9 on the Mohs scale.

22. The method of claim 12, wherein the planarization process comprises chemical-mechanical polishing.

23. A method of fabricating a shallow trench isolation, comprising the steps of:
providing a substrate having a plurality of elevated regions and a plurality of recessed regions, wherein a mask layer is formed over the elevated region, and a liner layer is formed on the recessed regions;
forming a fill material over the substrate to fill the recessed regions, wherein the fill material covers the mask layer and the liner layer;
performing an ion implantation process to implant atoms in the fill material to form a polishing stop layer in the fill material;
removing portions of fill material and polishing stop layer to expose the mask layer over the elevated regions; and
performing a planarization process to form a smooth surface.

24. The method of claim 23, wherein the step of providing the substrate comprises oxidizing the recessed region to form the liner layer.

25. The method of claim 23, further comprising a thermal step after forming the polishing stop layer.

26. The method of claim 23, wherein the bottom-surface level of the polishing stop layer above the recessed region is between the top surface of the mask layer and the bottom surface of the mask layer.

27. The method of claim 23, wherein the implanted atoms comprise nitrogen atoms.

28. The method of claim 27, wherein energy of the nitrogen atoms is between about 50 Kev and 100 Kev.

29. The method of claim 27, wherein dosage of the nitrogen atoms is between about $2 \times 10^{14}$ ions/cm$^2$ and $6 \times 10^{14}$ ions/cm$^2$.

30. The method of claim 27, wherein the nitrogen atoms is implanted for about 60 seconds to 70 seconds.

31. The method of claim 27, wherein depth of the polishing stop layer is between about 1000 Å and 2000 Å.

32. The method of claim 27, wherein the polishing stop layer has a hardness between about 8 and 9 on the Mohs scale.

33. A method of fabricating a shallow trench isolation, comprising the steps of:
providing a substrate having a plurality of elevated regions and recessed regions, wherein a mask layer is formed over the elevated region, and a liner layer is formed on the recessed regions;
forming a fill material over the substrate, wherein the fill material covers the mask layer and the liner layer and fills the recessed regions;
performing an ion implantation process to implant atoms in the fill material to form a polishing stop layer in the fill material; and
performing a planarization step to form a smooth surface over the substrate.

34. The method of claim 33, further comprising a thermal step after forming the polishing stop layer.

35. The method of claim 33, wherein the bottom-surface level of the polishing stop layer above the recessed region is between the top surface of the mask layer and the bottom surface of the mask layer.

36. The method of claim 33, wherein the implanted atoms comprises nitrogen atoms.

37. The method of claim 36, wherein energy of the nitrogen atoms is between about 50 Kev and 100 Kev.

38. The method of claim 36, wherein dosage of the nitrogen atoms is between about $2 \times 10^{14}$ ions/cm$^2$ and $6 \times 10^{14}$ ions/cm$^2$.

39. The method of claim 36, wherein the nitrogen atoms is implanted for about 60 seconds to 70 seconds.

40. The method of claim 36, wherein depth of the polishing stop layer is between about 1000 Å and 2000 Å.

41. The method of claim 36, wherein the polishing stop layer has a hardness between about 8 and 9 on the Mohs scale.

* * * * *